(12) United States Patent
Hoelzle et al.

(10) Patent No.: US 7,649,419 B2
(45) Date of Patent: Jan. 19, 2010

(54) DEVICE AND METHOD INCLUDING CURRENT MEASUREMENT AND/OR AMPLIFICATION

(75) Inventors: Josef Hoelzle, Bad Woerishofen (DE); Reinhold Unterricker, Vaterstetten (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/858,271

(22) Filed: Sep. 20, 2007

(65) Prior Publication Data

US 2008/0074182 A1 Mar. 27, 2008

(30) Foreign Application Priority Data

Sep. 21, 2006 (DE) .................... 10 2006 044 530

(51) Int. Cl.
*H03F 3/04* (2006.01)
(52) U.S. Cl. .................... 330/288; 323/315
(58) Field of Classification Search ............ 330/288; 323/315, 316

See application file for complete search history.

(56) References Cited

U.S. PATENT DOCUMENTS

| 4,267,519 | A  | * | 5/1981  | Schade, Jr. .......... 330/255 |
| 5,691,658 | A  | * | 11/1997 | Klein .................. 327/104 |
| 6,329,881 | B1 | * | 12/2001 | Tachigori ............ 330/308 |
| 6,798,250 | B1 |   | 9/2004  | Wile |
| 7,323,931 | B2 | * | 1/2008  | Hong et al. .......... 330/86 |

FOREIGN PATENT DOCUMENTS

DE 940716 3/1956

* cited by examiner

*Primary Examiner*—Henry K Choe
(74) *Attorney, Agent, or Firm*—Dicke, Billig & Czaja, PLLC

(57) ABSTRACT

A device and a method including current measurement and/or amplification is disclosed. One embodiment provides supplying a current to be measured to a current amplifier. The current is amplified by the current amplifier. The amplified current or a current generated is fed back therefrom to the current amplifier. The current amplifier may include a current mirror. Furthermore, at least one delay means may be used by which the process of current amplification and/or current feedback may be delayed correspondingly.

18 Claims, 4 Drawing Sheets

DEVICE AND METHOD INCLUDING CURRENT MEASUREMENT AND/OR AMPLIFICATION

CROSS-REFERENCE TO RELATED APPLICATIONS

This Utility patent application claims priority to German Patent Application No. DE 10 2006 044 530.9 filed on Sep. 21, 2007, which is incorporated herein by reference.

BACKGROUND

The invention relates to a device and a method including current measurement and/or amplification, in one embodiment with semiconductor devices.

Semiconductor devices, e.g., corresponding, integrated (analog or digital) computing circuits, semiconductor memory devices such as, for instance, functional memory devices (PLAs, PALs, etc.) and table memory devices (e.g., ROMs or RAMs, in particular SRAMs and DRAMs), etc. are subject to comprehensive tests during and after their manufacturing process.

For the common manufacturing of a plurality of (in general identical) semiconductor devices, a wafer (i.e. a thin disc of monocrystalline silicon) is used. The wafer is processed appropriately (e.g., subject successively to a plurality of coating, exposure, etching, diffusion, and implantation processes, etc.), and subsequently sewn apart (or e.g., scratched, and broken), so that the individual devices are then available.

During the manufacturing of semiconductor devices—even before all the desired, above-mentioned processes were performed on the wafer—(i.e. already in a semi-finished state of the semiconductor devices) the (semi-finished) devices (that are still available on the wafer) may be subject to appropriate test methods at one or a plurality of test stations by using one or a plurality of external test devices.

After the finishing of the semiconductor devices (i.e. after the performing of all the above-mentioned wafer processes), the semiconductor devices are subject to further test methods at one or a plurality of (further) test stations—for instance, by using appropriate (further) external test devices, the finished devices—that are still available on the wafer—may be tested appropriately ("wafer tests").

Correspondingly, one or a plurality of further tests (at corresponding further test stations, and by using appropriate, further external test devices) may be performed, for instance, after the incorporation of the semiconductor devices or chips in the corresponding semiconductor device packages, and/or e.g., after the incorporation of the semiconductor packages (along with the respectively included semiconductor devices) in corresponding electronic modules (so-called "module tests"), etc.

By using the above-mentioned test methods it is possible to identify, and then sort out (or partially also repair) defective semiconductor devices or modules, and/or—in correspondence with the test results achieved—to correspondingly modify or optimally adjust the respective process parameters used during the manufacturing of the devices, etc.

During the performing of the above-mentioned semiconductor device test methods, current measurements are frequently performed.

The currents occurring on the semiconductor devices and to be measured are, in general, relatively small, so that they have to be amplified correspondingly by the respective external test device used (or an external measuring device, respectively).

The smaller a current to be measured is, the larger is, in general, the risk that the respective measuring result is faulty.

The current to be measured may, for instance, be distorted by chip-internal leakage currents; the smaller the currents to be measured are, the larger is, in general, the leakage current share, and thus the measuring inaccuracy.

The performing of a current measurement by using the above-mentioned external measuring devices/external test devices is relatively complex and—caused by the prices of the measuring device/test device that are, in general, relatively high—relatively expensive.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a novel device and a novel method for current measurement and/or current amplification.

One or more embodiments provide a method for current measurement or current amplification, respectively, which includes supplying a current to be measured to a current amplifier; amplifying the current by the current amplifier; and feeding back the amplified current or a current generated therefrom to the current amplifier.

The current amplifier may include a current mirror.

Furthermore, at least one delay may be used, by using which the process of current amplification and/or of current feedback may be delayed correspondingly.

The feeding back of the amplified current or of the current generated therefrom to the current amplifier, in particular the current mirror, may be terminated after a predetermined period.

The feeding back of the amplified current or of the current obtained therefrom to the current amplifier, in particular the current mirror, may be terminated if the current or a value representing a measure for the intensity of the current exceeds a predetermined threshold value.

Figure 1:
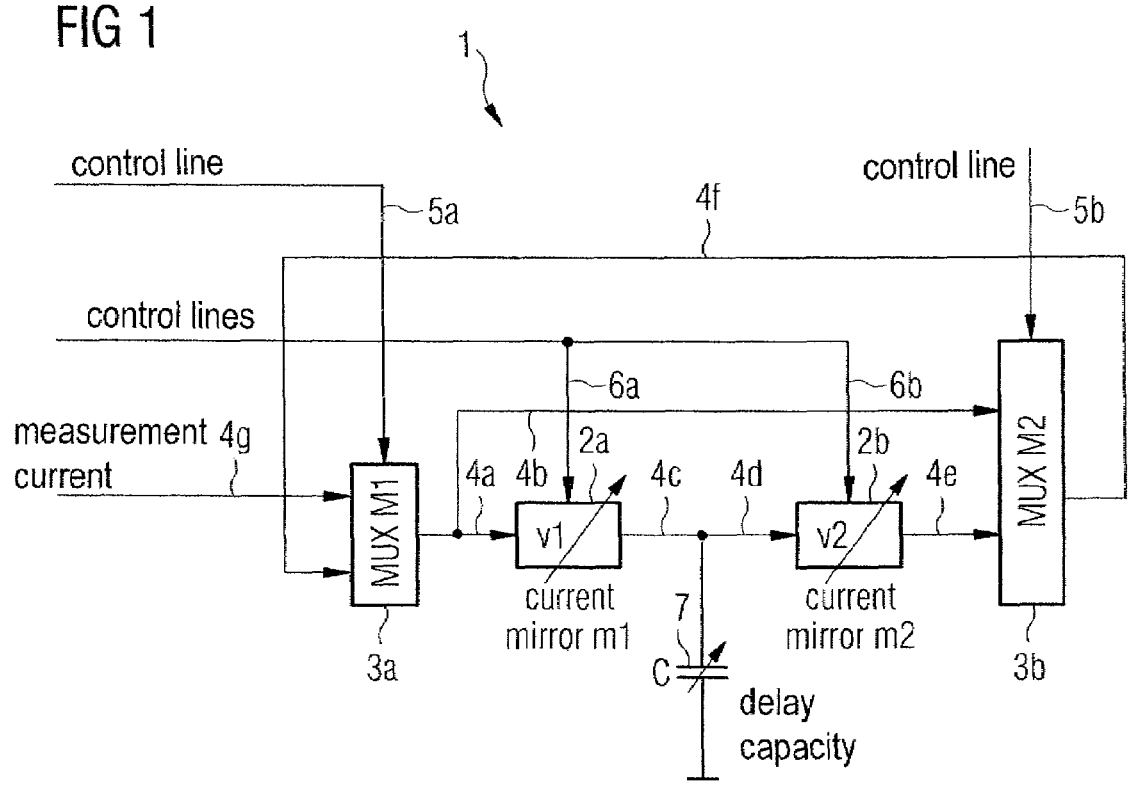
FIG. 1 illustrates a schematic diagram of a current measuring or current amplification device in accordance with an embodiment of the invention.

FIG. 1 illustrates a schematic diagram of a current measuring or current amplification device 1 in accordance with an embodiment of the invention.

The current measuring or current amplification device 1 may, for instance, be arranged on a semiconductor device/chip, e.g., a corresponding, integrated (analog or digital) computing circuit, a semiconductor memory device such as, for instance, a functional memory device (PLA, PAL, etc.), or a table memory device (e.g., ROM or RAM, in particular SRAM or DRAM), etc.

The current measuring or current amplification device 1 may, for instance, be used to measure or amplify an internal current occurring on the semiconductor device/chip itself (or generated on the semiconductor device itself, respectively) ("measurement current"), e.g., for test purposes (i.e. in a test operating mode of the semiconductor device), and/or in the actual operating mode of the semiconductor device, etc.

If the current measuring or current amplification device 1 is used for test purposes, it may be placed in a deactivated state in the actual operating mode of the semiconductor device (so that no current measurement/no current amplification is performed during the actual operating mode).

If the current measuring or current amplification device 1 is used for test purposes, the current measuring or current amplification device 1 may, for instance, be used for performing a corresponding semiconductor device test method.

The semiconductor device test method may, for instance, serve to identify and sort out (or possibly repair) a defective semiconductor device, and/or—in correspondence with the test results achieved—to correspondingly modify or optimally adjust the respective process parameters used during the manufacturing of semiconductor devices, etc.

During the performing of the test method, the semiconductor device on which the current measuring or current amplification device 1 is arranged may, for instance, still be available on a corresponding wafer, or may already be incorporated in a corresponding semiconductor device package or a corresponding electronic module, etc.

If the device 1 is used in the actual operating mode of the semiconductor device, it may, for instance, be used for amplification of a current occurring/generated on the semiconductor device, e.g., a photo current, etc.

The current measuring or current amplification device 1 may be used for the measurement or amplification of relatively small currents, e.g., of currents that are smaller than 1 mA, e.g., smaller than 500 µA or 100 µA, in particular smaller than 1 µA, e.g., in the range of some nanoamperes.

As results from FIG. 1, the current measuring or current amplification device 1 may include a plurality of current mirrors 2a, 2b (here: a first current mirror 2a ("current mirror m1") and a second current mirror 2b ("current mirror m2")), a capacitive element 7 connected between the current mirrors 2a, 2b and providing a corresponding delay capacity C, e.g., a capacitor, and a plurality of multiplexers 3a, 3b (here: a first multiplexer 3a ("MUX M1") and a second multiplexer 3b ("MUX M2")).

In other designs of the device 1, the capacitive element 7 may also be provided in some other place than illustrated in FIG. 1, e.g., in one of the current mirrors 2a, 2b, etc., and/or a plurality of capacitive elements may be provided instead of one single capacitive element 7, etc.

One output of the first multiplexer 3a is, via a line 4a, connected with an input of the first current mirror 2a, and, via a line 4b, with a first input of the second multiplexer 3b.

One output of the first current mirror 2a is, via a line 4c, connected with a first connection of the capacitive element 7. The first connection of the capacitive element 7 is, via a line 4d, connected to an input of the second current mirror 2b; the second connection of the element 7 may be connected to ground.

As results further from FIG. 1, one output of the second current mirror 2b is, via a line 4e, connected with a second input of the second multiplexer 3b.

One output of the second multiplexer 3b is, via a line 4f, connected to the second input of the first multiplexer 3a; a first input of the first multiplexer 3a is connected to a line 4g via which the current to be measured or to be amplified ("measurement current") can be supplied to the first multiplexer 3a.

Via a control signal present at a control line 5a that is connected to a control input of the first multiplexer 3a, it is possible to define whether the first input (i.e. the line 4g) or the second input (i.e. the line 4f) of the first multiplexer 3a is to be connected electroconductively with the output of the first multiplexer 3a (and the respective other input is to be electrically separated from the output of the first multiplexer 3a).

Correspondingly similar, via a control signal present at a control line 5b that is connected to a control input of the second multiplexer 3b, it is possible to define whether the first input (i.e. the line 4b) or the second input (i.e. the line 4e) of the second multiplexer 3b is to be connected electroconductively with the output of the second multiplexer 3b (and the respective other input is to be electrically separated from the output of the first multiplexer 3b).

The delay capacity C of the capacitive element 7 may be definitely preset (i.e. be invariable), or may alternatively be variably adjustable, i.e. have a value that can be fixed or modified in a variable manner.

For this purpose, a corresponding voltage-controlled barrier layer capacitance may, for instance be used as a capacitive element 7.

The first current mirror 2a may have a current mirror ratio of v1, and the second current mirror 2b a current mirror ratio of v2, wherein v1×v2 has to be larger than 1.

By using the first current mirror 2a, a current input in the first current mirror 2a via the input thereof is amplified corresponding to the current mirror ratio v1 of the first current mirror 2a, and is output at the output of the first current mirror 2a as a current amplified by the factor v1 (current amplification factor v1).

Correspondingly similar, by using the second current mirror 2b, a current input in the second current mirror 2b via the input thereof is amplified corresponding to the current mirror ratio v2 of the second current mirror 2b, and is output at the output of the second current mirror 2b as a current amplified by the factor v2 (current amplification factor v2).

The current mirror ratios or current mirror factors v1, v2 of the current mirrors 2a, 2b may be definitely preset (i.e. be invariable), or may alternatively be variably adjustable, i.e. have a value that can be fixed or modified in a variable manner.

In this case, the respectively desired current amplification factor may, for instance, be defined or adjusted by applying corresponding control signals to control lines 6a, 6b that are connected with control inputs of the current mirrors 2a, 2b.

The current mirrors 2a, 2b may—as will be explained in more detail below—each include a plurality of transistors, wherein the respective current amplification factor resulting for a current mirror depends on the number of the respective transistors used (or more exactly on the ratio of the number of transistors of a first group and a second group of transistors of the respective current mirror (cf. below)).

By activating or deactivating transistors provided in a current mirror (e.g., as a function of the control signals present at the above-mentioned control lines 6a, 6b), the number of active transistors of a current mirror, or more exactly the above-mentioned transistor number ratio, can be changed, and thus the current mirror ratio/current amplification factor resulting for a respective current mirror can be adjusted variably.

For performing a current measurement or current amplification, in the device 1 illustrated in FIG. 1, in a first process the current to be measured or to be amplified ("measurement current") is supplied to the first input of the first multiplexer 3a via the line 4g, and transmitted to the output of the first multiplexer 3a, i.e. via the line 4a to the first current mirror 2a.

To this end—by using a corresponding control signal applied to the control line 5a—the first multiplexer 3a is, for a predetermined period t1, placed in a state in which the first input of the first multiplexer 3a (i.e. the line 4g) is conductively connected with the output of the first multiplexer 3a, and the second input of the first multiplexer 3a (i.e. the line 4f) is electrically separated from the output of the first multiplexer 3a.

The measurement current supplied to the first current mirror 2a is amplified by the first current mirror 2a by the above-mentioned current amplification factor v1, and the amplified measurement current is—afflicted with a certain delay caused by the delay capacity C of the capacitive element 7—transmitted to the second current mirror 2b.

The measurement current amplified by the above-mentioned current amplification factor v1 and supplied to the second current mirror 2b is amplified by the second current mirror 2b by the above-mentioned current amplification factor v2, and the resulting measurement current is supplied to the second input of the second multiplexer 3b via the line 4e, and transmitted from there to the output of the second multiplexer 3b, i.e. via the line 4f to the second input of the first multiplexer 3a.

To this end—by using a corresponding control signal applied to the control line 5b—the second multiplexer 3b is placed in a state in which the second input of the second multiplexer 3b (i.e. the line 4e) is conductively connected with the output of the second multiplexer 3b, and the first input of the second multiplexer 3b (i.e. the line 4b) is electrically separated from the output of the second multiplexer 3b.

The measurement current supplied to the second input of the first multiplexer by the second multiplexer 3b via the line 4f is transmitted to the output of the first multiplexer 3a, i.e. via the line 4a to the first current mirror 2a.

To this end, after the above-mentioned predetermined period t1—by using a corresponding control signal applied to the control line 5a—the first multiplexer 3a is caused to change its state, i.e. is placed in a state in which the second input of the first multiplexer 3a (i.e. the line 4f) is conductively connected with the output of the first multiplexer 3a, and the first input of the first multiplexer 3a (i.e. the line 4g) is electrically separated from the output of the first multiplexer 3a.

In other words, the measurement current that has already been amplified as explained above and that is output by the second current mirror 2b is fed back to the first current mirror 2a, and subsequently—again—amplified by the first current mirror 2a by the above-mentioned factor v1.

The—again—amplified measurement current is—again afflicted with a certain delay caused by the delay capacity C of the capacitive element 7—transmitted to the second current mirror 2b, and amplified there—again—by the above-mentioned current amplification factor v2, and the—again—amplified measurement current is again fed back to the first current mirror 2a, etc.

The multiplexers 3a, 3b form a feedback loop including the current mirrors 2a, 2b, the feedback loop having—due to the current amplifications in the amount of v1 or v2, respectively, caused by the current mirrors 2a, 2b—a total loop amplification of v1×v2.

The current flowing through the lines 4a, 4e, 4f, etc. of the feedback loop then continues to increase.

After a further predetermined period t2, the above-described continuous amplification of the measurement current may be terminated.

To this end, for instance, the second multiplexer 3b may—by using a corresponding control signal applied to the control line 5b—be caused to change its state, i.e. be placed in a state in which the first input of the second multiplexer 3b (i.e. the line 4b) is conductively connected with the output of the second multiplexer 3b, and the second input of the second multiplexer 3b (i.e. the line 4e) is electrically separated from the output of the second multiplexer 3b.

The multiplexers 3a, 3b then form a new feedback loop that does no longer contain the current mirrors 2a, 2b and that has a loop amplification of 1.

The current flowing through the lines 4b, 4f, etc. of the new feedback loop will then remain substantially constant.

The resulting, substantially constant current flowing through the lines 4b, 4f, etc. may then—in particular if the current measuring or current amplification device 1 is used for amplification purposes—be supplied to corresponding further devices available on the semiconductor device for further processing.

In one embodiment, the resulting, substantially constant current flowing through the lines 4b, 4f, etc. of the device 1 may—in particular if the current measuring or current amplification device 1 is used for test purposes—be transmitted to a corresponding pad or a corresponding pin of the semiconductor device, and from there, for instance, to a corresponding, external measuring device.

In the external measuring device, the intensity of the measurement current that has been amplified by the device 1 as described above may be determined, and the intensity of the measurement current actually to be measured and initially input in the device 1 via the line 4g may be derived therefrom.

In one embodiment, this function may also be fulfilled by a measuring circuit provided on the semiconductor device itself, instead by an external measuring device: the above-mentioned, resulting, substantially constant, amplified current flowing through the lines 4b, 4f, etc. of the device 1 may be supplied to this measuring circuit. In the measuring circuit, the intensity of this current may be determined, and the intensity of the measurement current actually to be measured and initially input in the device 1 via the line 4g may be derived therefrom. The measuring value for the current initially supplied to the device 1 via the line 4g as determined by the measuring circuit may be transmitted by the measuring circuit to corresponding pads or pins of the semiconductor device, i.e. may be made available from outside.

Instead of measuring, as explained, the intensity of the substantially constant current flowing through the lines 4b, 4f, etc. of the device 1 and resulting after the above-mentioned further predetermined period t2, any other, alternative methods may also be used to determine the intensity of the current initially supplied to the device 1 via the line 4g: For instance, the period t may be measured which passes until the measurement current that is continuously amplified by the device 1 has reached a predetermined intensity, i.e. a predetermined threshold value. From the period t determined, the intensity of the current initially supplied to the device 1 via the line 4g may then be derived. The period t until the threshold has been reached may, for instance, be determined by a (clock) counter that was reset to a counted measurand 0 at the beginning of the measuring process; the—digital—counted measurand of the (clock) counter on reaching of the threshold value constitutes a measure for the intensity of the current initially supplied to the device 1 via the line 4g. In other words, a corresponding, novel AD conversion (analog-digital conversion) is then performed by the device 1 and the clock counter, namely a conversion of the analog current initially supplied to the device 1 via the line 4g to a (digital) counted measurand provided by the clock counter. The counted measurand provided by the clock counter may be written in an appropriate register by the clock counter, which may be accessed from outside.

For calibration of the device 1, a control current of known intensity may be used and be applied to the device 1 from outside (in particular in a state of the multiplexers 3a, 3b in which, in the first multiplexer 3a, the second input thereof, i.e. the line 4f, is connected with the output thereof, and in which, in the second multiplexer 3b, the second input thereof, i.e. the line 4e, is connected with the output thereof, i.e. in a state of the multiplexers in which the above-mentioned feedback loop is formed with the loop amplification v1×v2).

From the rate in which the control current increases, the actual amount of the current mirror ratios/current amplification factors, or the delay capacity C, respectively, may be derived, so that manufacturing tolerances during the manufacturing of the current mirrors 2a, 2b/of the capacitive element 7 are irrelevant for the measuring accuracy of the actual measurement (i.e. the above-described measurement of the intensity of the measurement current supplied to the device 1 via the line 4g).

In further variants of the above-described embodiment—in particular for measuring relatively high currents—a current of known intensity may be subtracted from the respective measurement current to be measured, and the current resulting from the subtraction may be supplied to the device 1 via the line 4g for measurement or amplification, respectively, instead of the measurement current.

In one or more embodiments, for the measurement of relatively high currents, a delay capacity C that is increased vis-à-vis the measurement of relatively low currents may be used. By the increase of the delay capacity C, the loop running time is increased. The measurement current continuously amplified in the above-described manner by the device 1 will then increase less quickly than with a correspondingly lower delay capacity C.

In further variants, the above-mentioned current mirrors illustrated in FIG. 1 may, for instance, also be replaced by Gilbert cells. The above-explained principle for the measurement or amplification of currents may then in analogy also be used for the measurement or amplification of voltages.

Figure 2:
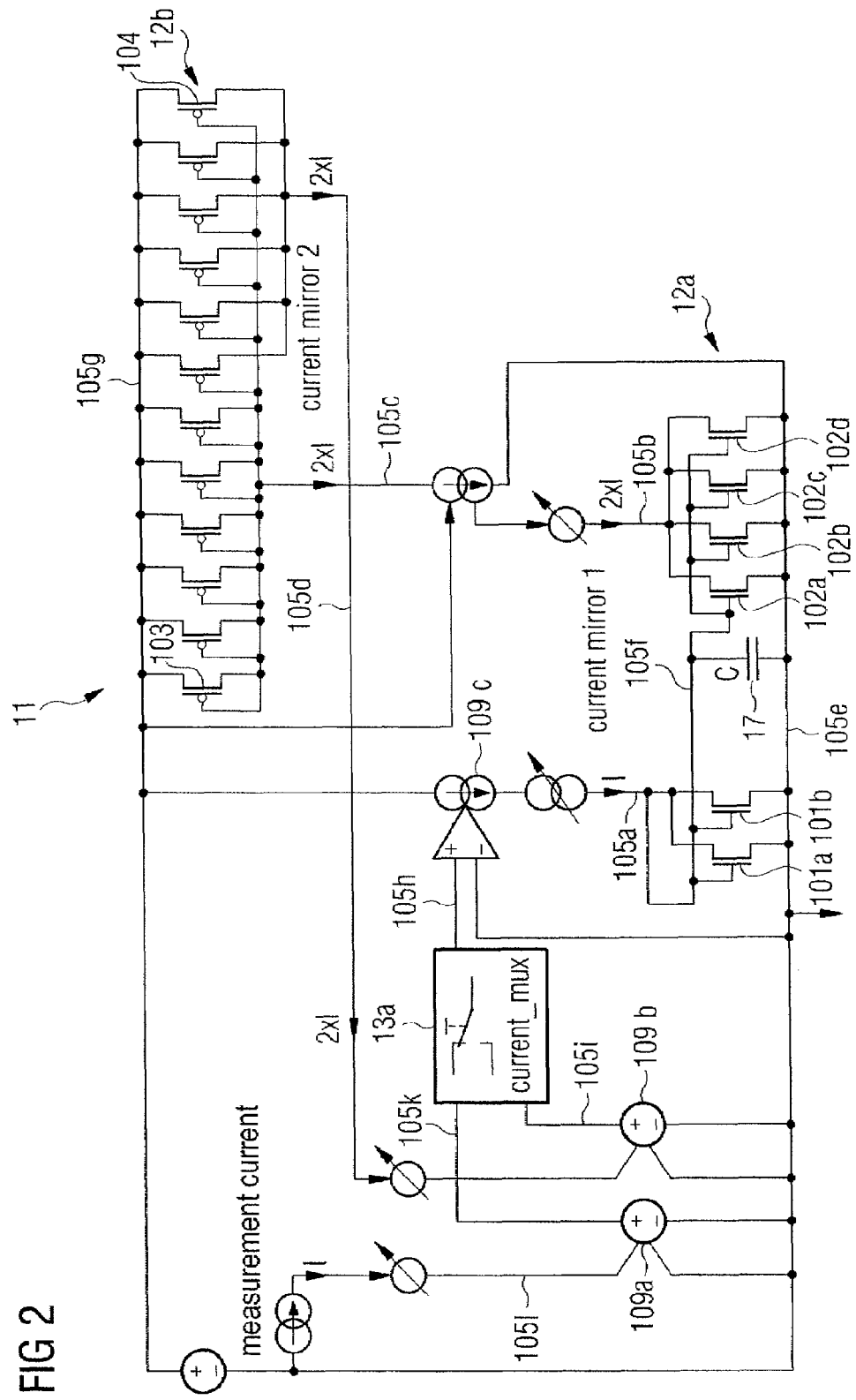
FIG. 2 illustrates an exemplary, schematic detailed representation of a circuit implementing the current measurement or current amplification principle illustrated by using FIG. 1.

FIG. 2 illustrates an exemplary, schematic detail representation of a circuit 11 implementing the current measurement or current amplification principle illustrated by using FIG. 1 (here: illustrated in the form of a SPECTRE simulation circuit diagram).

The circuit 11 includes a plurality of current mirrors 12a, 12b (here: a first current mirror 12a ("current mirror 1") and a second current mirror 12b ("current mirror 2")).

In each current mirror 12a, 12b, a plurality of transistors 101a, 101b, 102a, 102b, 102c, 102d, 103, 104 are provided.

Each current mirror 12a, 12b includes, corresponding to conventional current mirrors, a first and a second group of transistors:

The first current mirror 12a includes a first group of—here: two—transistors 101a, 111b, the source-drain paths of which are each connected with a line 105a, and a second group of—here: four—transistors 102a, 102b, 102c, 102d, the source-drain paths of which are each connected with a line 105b.

Correspondingly similar, the second current mirror 12b includes a first group of—here: six—transistors 103, the source-drain paths of which are each connected with a line 105c, and a second group of—here: also six—transistors 104, the source-drain paths of which are each connected with a line 105d.

The current mirror ratio v1, v2 (i.e. the current amplification factor v1, v2) resulting for a respective current mirror 12a, 12b depends on the ratio of the transistor number of the above-mentioned second and first transistor groups, more exactly: on the quotient of the number of transistors in the second group and the number of transistors in the first group.

In the present example, there thus results for the first current mirror 12a a current mirror ratio/current amplification factor v1 of 4:2, i.e. 2, and for the second current mirror 12b a current mirror ratio/current amplification factor v2 of 6:6, i.e. 1.

As results from FIG. 2, the source-drain paths of the first group of transistors 101a, 101b of the first current mirror 12a are—except, as already mentioned above, to the line 105a—additionally connected to a line 105e.

Correspondingly similar, the source-drain paths of the second group of transistors 102a, 102b, 102c, 102d of the first current mirror 12a are—except, as already mentioned above, to the line 105b—additionally also connected to the line 105e.

The gates of the first group of transistors 101a, 101b of the first current mirror 12a are connected to the line 105a.

Correspondingly similar, the gates of the second group of transistors 102a, 102b, 102c, 102d of the first current mirror 12a are also connected to the line 105a, namely via a line 105f.

Between the line 105f and the line 105e, a capacitor 17 acting as a capacitive element is connected, namely at a place positioned between the gates of the transistors 101a, 101b of the first group and the gates of the transistors 102a, 102b, 102c, 102d of the second group.

As results further from FIG. 2, the source-drain paths of the first group of transistors 103 of the second current mirror 12b are—except, as already mentioned above, to the line 105c—additionally connected to a line 105g.

Correspondingly similar, the source-drain paths of the second group of transistors 104 of the second current mirror 12b are—except, as already mentioned above, to the line 105d, additionally also connected to the line 105g.

The gates of the first group of transistors 103 of the second current mirror 12b are connected to the line 105c.

Correspondingly similar, the gates of the second group of transistors 104 of the second current mirror 12b are also connected to the line 105c.

The above-mentioned capacitor 17 acting as a capacitive element provides a corresponding delay capacity C for the circuit 11.

As results from FIG. 2, the circuit 11 may further include one or a plurality of multiplexers 13a.

One output of the multiplexer 13a is, via a line 105h, connected to the line 105a, i.e. an input of the first current mirror 12a.

As results further from FIG. 2, the line 105d, i.e. one output of the second current mirror 12b, is, via a line 105i, connected with a second input of the multiplexer 13a.

A first input of the multiplexer 13a is connected to a line 105k that is connected with a line 105l via which a current to be measured or to be amplified ("measurement current") may be supplied to the multiplexer 13a.

By using the first current mirror 12a, a current I input in the first current mirror 12a via the input thereof, i.e. the line 105a, is amplified corresponding to the above-mentioned current mirror ratio v1=2 of the first current mirror 12a, and is output at an output of the first current mirror 12a, i.e. the line 105b, as a current amplified by the factor v1; at the line 105b, a current of 2×I will then be present.

Correspondingly similar, by using the second current mirror 12b, a current input in the second current mirror 12b via the input thereof, i.e. the line 105c, is amplified corresponding to the above-mentioned current mirror ratio v2 of the second current mirror 12b, and is output at the output of the second current mirror 12b, i.e. at the line 105d, as a current amplified by the factor v2. Since, in the example illustrated in FIG. 2, v2=1, no amplification takes place in the instant case in the second current mirror 12b.

The switching elements 109a, 109b, 109c, etc. provided in FIG. 2 in addition to the elements described in detail above (here: corresponding current-controlled or voltage-controlled current source elements) have no electric function, but serve to adapt the signals to the requirements of, for instance, the multiplexer 13a—simulated in the instant case in the form of a VERILOG-A simulation description.

For performing a current measurement or current amplification, in the circuit 11 illustrated in FIG. 2, the current to be measured or to be amplified ("measurement current") is, in a first method process, supplied to the first input of the multiplexer 13a via the lines 105l, 105k.

During the above-mentioned first method process, the multiplexer 13a is in a state in which the first input of the multiplexer 13 (i.e. the line 105k) is conductively connected with the output of the multiplexer 13a, i.e. the line 105h, and the second input of the multiplexer 13a (i.e. the line 105i) is electrically separated from the output of the multiplexer 13a.

The above-mentioned first method process, and the subsequent, further method processes (cf. below) are defined in the VERILOG-A simulation description mentioned above.

The measurement current supplied to the circuit 11, supplied to the line 105h due to the above-mentioned state of the multiplexer 13a is, via the line 105h, transmitted to the line 105a, i.e. the input of the first current mirror 12a.

Consequently, the first current mirror 12a outputs—afflicted with a certain delay caused by the delay capacity C of the capacitor 17 (during which the capacitor 17 is continued to be charged)—a current that is amplified by the above-mentioned current amplification factor v1 vis-à-vis the supplied measurement current at the output of the first current mirror 12a, i.e. at the lines 105b, 105c (and thus at the input of the second current mirror 12b).

In reaction to this, the second current mirror 12b outputs a current amplified by the above-mentioned current amplification factor v2 (here: v2=1) vis-à-vis the supplied current, i.e. in the instant case a current mirrored with the factor 1:1, at the output of the second current mirror 12b, i.e. at the line 105d.

In a second method process following the above-mentioned first one, the multiplexer 13a is caused to change its state, i.e. is placed in a state in which the second input of the multiplexer 13a (i.e. the line 105i) is conductively connected with the output of the multiplexer 13a, i.e. the line 105h, and the first input of the multiplexer 13a (i.e. the line 105k) is electrically isolated from the output of the multiplexer 13a.

The above-mentioned current output by the second current mirror 12b at the line 105d and supplied to the second input of the multiplexer 13a via the line 105i is thus transmitted to the line 105h via the multiplexer 13a, and from there to the line 105a, i.e. to the input of the first current mirror 12a.

The measurement current already amplified as explained above and output by the second current mirror 12b is fed back to the first current mirror 12a, and subsequently—again—amplified by the first current mirror 12a by the above-mentioned factor v1.

The—again—amplified measurement current is—again afflicted with a certain delay caused by the delay capacity C of the capacitor 17 (during which the capacitor 17 is continued to be charged)—supplied to the second current mirror 12b, mirrored by the second current mirror 12b, and—via the multiplexer 13a—again fed back to the first current mirror 12a, and amplified by the first current mirror 12a, etc.

The current I flowing through the lines 105a, 105b, 105d, etc. will then continue to increase, in particular, for instance, substantially in correspondence with the formula:

$$I_t = \frac{1}{\left(\frac{1}{\sqrt{I_{t0}}} - \frac{\sqrt{k}}{C}t\right)^2}$$

wherein $I_t$ is the current at the time t, $I_{t0}$ the current at the time t0, i.e. the original measurement current supplied via the line 105l at the beginning of the first method process, k a constant conditioned by the physics of the transistors 101a, etc., and C the delay capacity C of the capacitor 17.

Figure 3:
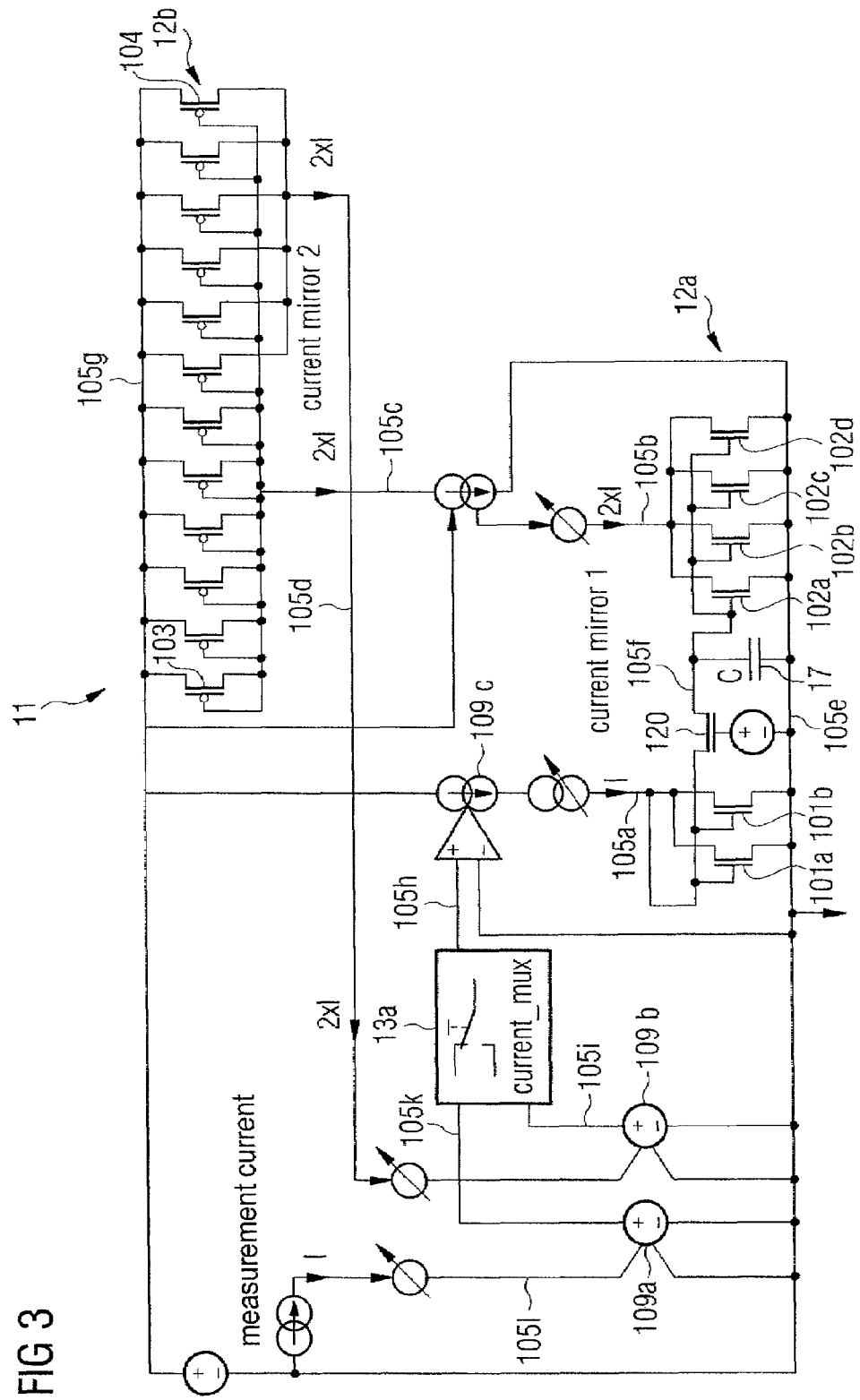
FIG. 3 illustrates an exemplary, alternative variant of the circuit illustrated in FIG. 2.

FIG. 3 illustrates an exemplary, alternative variant of the circuit 11 illustrated in FIG. 2.

It is of a structure that is correspondingly similar or identical to that of the circuit 11 illustrated in FIG. 2, except that a further transistor 120 is connected between the capacitor 17 and the first group of transistors 101a, 101b of the first current mirror 12a.

As results from FIG. 3, the source-drain path of the further transistor 120 is, via a first connection of the further transistor 120, connected with the gates of the first group of transistors 101a, 101b of the first current mirror 12a, and with the above-mentioned line 105a, as well as the source-drain paths of the first group of transistors 101a, 101b of the first current mirror 12a.

Moreover, the source-drain path of the further transistor 120 is, via a second connection of the further transistor 120, connected with the capacitor 17 (and thus also with the gates of the second group of transistors 102a, 102b, 102c, 102d of the first current mirror 12a).

During the above-mentioned first and second method processes of the current measurement or current amplification, respectively, the further transistor 120 in the circuit 11 illustrated in FIG. 3 is placed in a conductive state. The first and second method processes proceed correspondingly similar or identical to the ones described above by using FIG. 2 and the circuit 11 illustrated there.

After a predetermined period—at the beginning of a third method process following the second method process—the further transistor 120 is placed from the above-mentioned conductive state in a locked state.

The capacitor 17 is then electrically separated from the first group of transistors 101a, 101b of the first current mirror, i.e. is no longer charged. Thus, the charge stored on the capacitor 17 remains at the intensity achieved last at the end of the second method process, i.e. remains substantially constant. Hence, the voltage dropping across the capacitor 17 also remains substantially constant during the above-mentioned third method process.

Consequently, the first current mirror 12a then outputs at the output thereof, i.e. at the lines 105b, 105c, a current of constant intensity which may be used as output current of the circuit 11.

For instance, a current coupled out from the circuit 11 by an additional—not illustrated—current mirror (or an additional—not illustrated—group of transistors) may also be used as output current of the circuit 11, wherein the additional group of transistors may, for instance, be constructed and connected like the second group of transistors 104 of the second current mirror 12b, except that the source-drain paths of the additional transistors do not, as in the transistors 104, control the line 105d, but an additional, separate—not illustrated output line.

Figure 4:
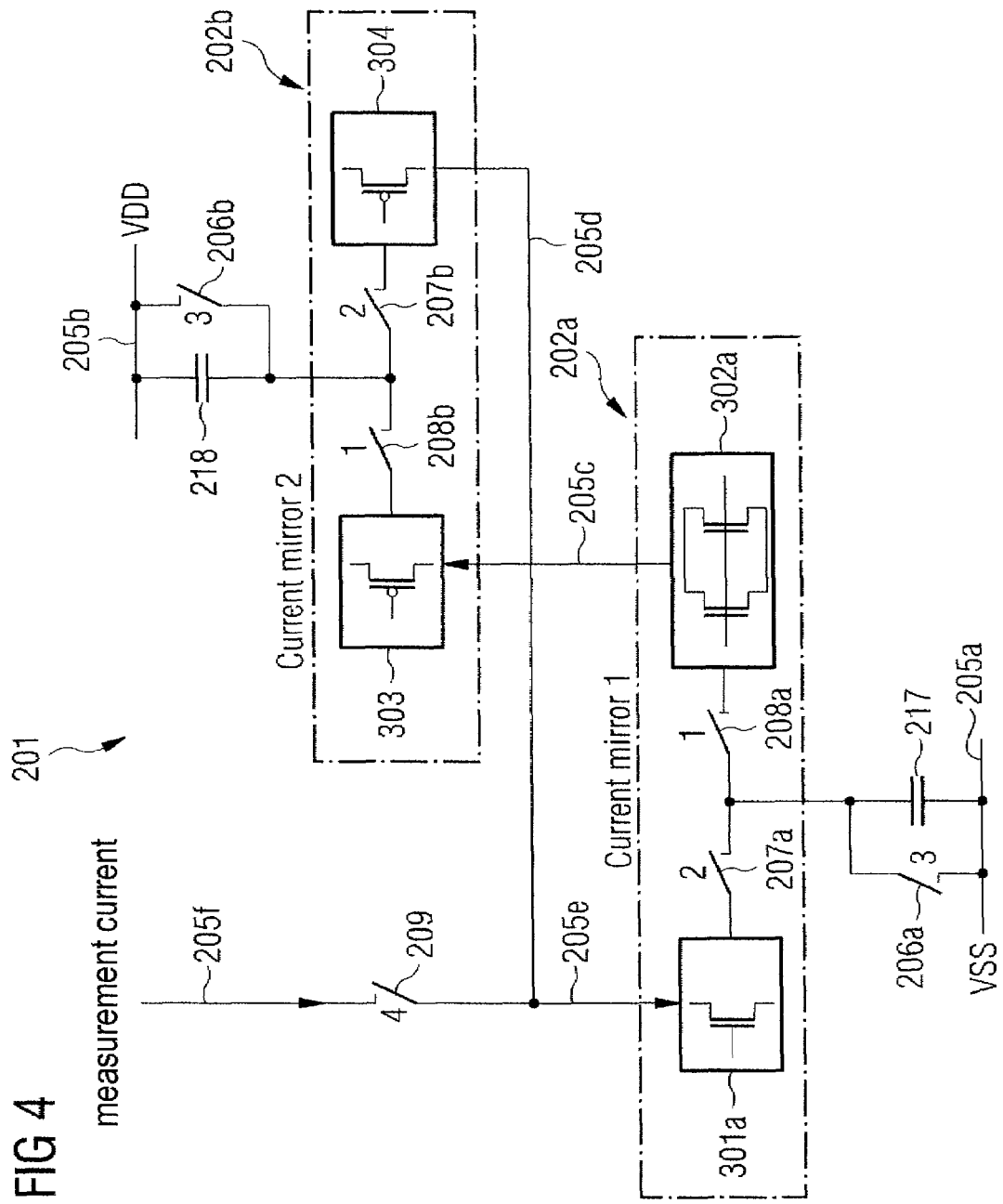
FIG. 4 illustrates a schematic diagram of a current measuring or current amplification device according to a further, alternative embodiment of the invention.

FIG. 4 illustrates a schematic diagram of a current measuring or current amplification device 201 according to a further, alternative embodiment of the invention.

The current measuring or current amplification device 201 may include a plurality of current mirrors 202a, 202b (here: a first current mirror 202a ("current mirror 1") and a second current mirror 202b ("current mirror 2")).

In each current mirror 202a, 202b, a plurality of transistors 301a, 302a, 303, 304 are provided.

Each current mirror 202a, 202b includes, like conventional current mirrors, a first and a second group of transistors:

The first current mirror 202a includes a first group of—here: e.g., one—transistor 301a and a second group of—here: e.g., two—transistors 302a.

Correspondingly similar, the second current mirror 202b includes a first group of—here: one—transistor 303 and a second group of—here: also one—transistor 304.

The current mirror ratio v1, v2 (i.e. the current amplification factor v1, v2) resulting for a respective current mirror 12a, 12b depends on the ratio of the transistor number of the above-mentioned second and first transistor groups, more exactly on the quotient of the number of transistors in the second group and the number of transistors in the first group.

In the present embodiment, a current mirror ratio/current amplification factor v1 of 2:1, i.e. 2, thus results for the first current mirror 202a, and a current mirror ratio/current amplification factor v2 of 1:1, i.e. 1, for the second current mirror 202b.

Correspondingly similar as in the first current mirrors 12a illustrated in FIGS. 2 and 3, in the first current mirror 202a illustrated in FIG. 4, a capacitor 217 is also connected between the first group and the second group of transistors 301a, 302a of the first current mirror 202a (more exactly: between the gates of the first group of transistors 301a of the first current mirror 202a and the gates of the second group of transistors 302a of the first current mirror 202a).

Correspondingly similar, in the second current mirror 202b, a capacitor 218 is also connected between the first group and the second group of transistors 303, 304 of the second current mirror 202b (more exactly: between the gates of the first group of transistors 303 of the second current mirror 202b and the gates of the second group of transistors 304 of the second current mirror 202b).

The capacitor 217 is—except to the gates of the transistors 301a, 302a of the first current mirror 202a—additionally connected to a line 205a at which a voltage VSS is present. Correspondingly similar, the capacitor 218 is—except to the gates of the transistors 303, 304 of the second current mirror 202b—additionally connected to a line 205b at which a voltage VDD is present.

As results from FIG. 4, a switch 206a is connected in parallel to the capacitor 217, and a switch 206b in parallel to the capacitor 218.

Furthermore, a switch 207a is provided between the gates of the first group of transistors 301a of the first current mirror 202a and the capacitor 217, and a switch 208a between the gates of the second group of transistors 302a of the first current mirror 202a and the capacitor 217.

Correspondingly similar, a switch 208b is provided between the gates of the first group of transistors 303 of the second current mirror 202b and the capacitor 218, and a switch 207b between the gates of the second group of transistors 304 of the second current mirror 202b and the capacitor 218.

One output of the first current mirror 202a (which may be connected with the source-drain paths of the second group of transistors 302a of the first current mirror 202a) is, via a line 205c, connected to an input of the second current mirror 202b (which may be connected to the source-drain paths and the gates of the first group of transistors 303 of the second current mirror 202b).

As results further from FIG. 1, one output of the second current mirror 202b (which may be connected with the source-drain paths of the second group of transistors 304 of the second current mirror 202b) is, via a line 205d and a line 205e, fed back to an input of the first current mirror 202a (which may be connected with the source-drain paths and the gates of the first group of transistors 301a of the first current mirror 202a).

Via a switch 209, the line 205e is connected to a line 205f via which the current to be measured or to be amplified ("measurement current") can be supplied to the device 201.

Current measurement or current amplification by using the device 201 illustrated in FIG. 4 may be subdivided in several phases, namely—as will be explained in more detail in the following—in a "reset phase", a "measurement current charging phase", and the actual "measurement or amplification phase".

During the reset phase—that is performed in a first process—, the switches 206a, 206b, 207a, 207b, 208a, 208b are closed and the switch 209 is opened. Thus, the capacitors 217, 218 and the current mirrors 202a, 202b are discharged.

In the measurement current charging phase—that follows the reset phase—, the switches 209, 207a, 207b are closed and the switches 208a, 208b, 206a, 206b are opened.

Thus, the current to be measured or to be amplified ("measurement current") is, via the lines 205f, 205e, supplied to the input of the first current mirror 202a, and the capacitor 217 provided in the first current mirror 202a is charged.

In the measurement or amplification phase—that follows the measurement current charging phase—, the switches 208a, 208b are first of all closed and the switches 207a, 207b as well as the switches 209, 206a, 206b are opened. Subsequently, the switches 207a, 207b are closed and the switches 208a, 208b are opened; the switches 209, 206a, 206b remain opened. Next, the switches 208a, 208b are again closed and the switches 207a, 207b are opened (the switches 209, 206a, 206b remain opened), etc. In other words, during the measurement or amplification phase—with continuously opened switches 209, 206a, 206b—the switches 208a, 208b and the switches 207a, 207b are alternately closed.

By the closing of the switches 208a, 208b, the capacitor 217—charged during the measurement current charging phase—is connected with the gates of the second group of transistors 302a of the first current mirror 202a.

Consequently, the first current mirror 202a outputs at the current mirror output, i.e. at the line 205c, a current that is amplified by the above-mentioned current amplification factor v1=v2 vis-à-vis the above-mentioned measurement current supplied during the measurement current charging phase.

Via the line 205c, the amplified current is supplied to the input of the second current mirror 202b, and the capacitor 218 provided in the second current mirror 202b is charged.

By the subsequent closing of the switches 207a, 207b, the—charged—capacitor 218 is connected with the gates of the second group of transistors 304 of the second current mirror 202b.

Consequently, the second current mirror 202b outputs at the current mirror output, i.e. at the line 205d, a current mirrored, due to the above-mentioned current amplification factor v2=1, in the ratio 1:1 with respect to the current supplied to the second current mirror 202b via the line 205c (or alternatively—with a current amplification factor v2>1—a correspondingly amplified current).

Via the line 205d, the amplified current is fed back to the input of the first current mirror 202a, and the capacitor 217 provided in the first current mirror 202a is continued to be charged.

By the subsequent closing of the switches 208a, 208b, the—further charged—capacitor 217 is connected with the gates of the second group of transistors 302a of the first current mirror 202a.

Consequently, the first current mirror 202a outputs at the current mirror output, i.e. at the line 205c, a current that is even further amplified vis-à-vis the above-mentioned current that had already been amplified.

Via the line 205c, the further amplified current is supplied to the input of the second current mirror 202b, and the capacitor 218 provided in the current mirror 202b is continued to be charged, etc.

The charge of the capacitors 217, 218 and the current flowing, for instance, through the lines 205c, 205d thus continue to increase process by process.

In a first variant, the measurement or amplification phase may be terminated after a predetermined period, e.g., in that the switches 208a, 208b are then left in the above-mentioned closed state and the switches 207a, 207b as well as the switches 209, 206a, 206b in the above-mentioned opened state (or alternatively, for instance, the switches 207a, 207b in the above-mentioned closed state and the switches 208a, 208b as well as the switches 209, 206a, 206b in the above-mentioned opened state).

The charge of the capacitors 217, 218 and the current flowing, for instance, through the line 205c (or 205d) then remain substantially constant. The charge of the capacitors 217, 218, or the charge dropping across the capacitors 217, 218, respectively, and the intensity of the current flowing through the line 205c (or 205d) each constitute a measure for the intensity of the measurement current initially supplied to the device 201 via the line 205f.

In a further variant, the measurement or amplification phase may be terminated if the charge of the capacitors 217, 218, or the voltage dropping across the capacitors 217, 218, respectively, and/or the intensity of the current flowing through the line 205c (or 205d) reaches a predetermined threshold value (again, for instance, in that the switches 208a, 208b are then left in the above-mentioned closed state and the switches 207a, 207b as well as the switches 209, 206a, 206b in the above-mentioned opened state (or alternatively, for instance, the switches 207a, 207b in the above-mentioned closed state and the switches 208a, 208b as well as the switches 209, 206a, 206b in the above-mentioned opened state)).

The time passed until the above-mentioned threshold value has been reached constitutes a measure for the intensity of the measurement current initially supplied to the device 201 via the line 205f. For determining this period, a counter may, for instance, be used which determines how often the switches 207a, 207b, and/or the switches 208a, 208b were placed in the above-mentioned closed state during the above-mentioned measurement or amplification phase.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating a semiconductor device including current measurement and/or current amplification, comprising:
   supplying a current to be measured to a current amplifier;
   amplifying the current by the current amplifier;
   feeding back the amplified current or a current generated therefrom to the current amplifier; and
   one of terminating the feeding back of the amplified current or of the current generated therefrom to the current amplifier after a predetermined period, and terminating the feeding back of the amplified current or of the current generated therefrom to the current amplifier if the current or a value representing a measure for the intensity of the current exceeds a predetermined threshold value.

2. The method of claim 1, wherein the current amplifier comprises a current mirror.

3. The method of claim 2, which additionally comprises:
   supplying the current amplified by the current mirror to a further current mirror;
   mirroring the amplified current by the further current mirror; and
   feeding back the mirrored current to the current mirror.

4. The method of claim 3, comprising further amplifying the amplified current during the mirroring of the amplified current by the further current mirror.

5. The method of claim 1, comprising:
   amplifying the current fed back to the current amplifier by the current amplifier.

6. The method of claim 1, comprising:
   delaying the current amplification and/or the current feedback by at least one delay means.

7. The method of claim 6, wherein the delay comprises at least one capacitive element.

8. The method of claim 1, wherein the delay comprises at least one switching element.

9. The method of claim 2, wherein the amplifying of the current by the current amplifier comprises:

connecting a capacitive element provided in the current mirror with a first transistor or a first group of transistors of the current mirror, and separating the capacitive element from a second transistor or a second group of transistors of the current mirror.

10. The method of claim 9, wherein the amplifying of the current by the current amplifier further comprises:

separating the capacitive element from the first transistor or the first group of transistors of the current mirror, and connecting the capacitive element with the second transistor or the second group of transistors of the current mirror.

11. A device including current measurement or current amplification, respectively, which comprises:

a current amplifier; and a circuit for feeding back a current amplified by the current amplifier or a current generated therefrom to the current amplifier, the circuit configured to one of terminate the feeding back of the amplified current or of the current generated therefrom to the current amplifier after a predetermined period, and terminate the feeding back of the amplified current or of the current generated therefrom to the current amplifier if the current or a value representing a measure for the intensity of the current exceeds a predetermined threshold value.

12. The device of claim 11, wherein the current amplifier comprises a current mirror.

13. The device of claim 12, which comprises at least one further current mirror.

14. The device of claim 11, which additionally comprises at least one delay.

15. The device of claim 14, comprising wherein the delay is positioned between the current mirror and the further current mirror.

16. The device of claim 14, comprising wherein the delay is provided in the current mirror or the further current mirror, respectively.

17. The device of claim 14, comprising wherein the delay is, via a first switching element, adapted to be connected with a first transistor or a first group of transistors of the current mirror and, via a further switching element, with a second transistor or a second group of transistors of the current mirror.

18. A method for operating a semiconductor device including current measurement and/or current amplification, comprising:

supplying a current to be measured to a current amplifier comprising a current mirror;

amplifying the current by the current amplifier, the amplifying comprising connecting a capacitive element provided in the current mirror with a first transistor or a first group of transistors of the current mirror, separating the capacitive element from a second transistor or a second group of transistors of the current mirror, separating the capacitive element from the first transistor or the first group of transistors of the current mirror, and connecting the capacitive element with the second transistor or the second group of transistors of the current mirror; and feeding back the amplified current or a current generated therefrom to the current amplifier.

* * * * *